(12) United States Patent
Fukuzumi et al.

(10) Patent No.: US 12,463,059 B2
(45) Date of Patent: Nov. 4, 2025

(54) PRODUCTION METHOD FOR SEMICONDUCTOR PACKAGES

(71) Applicant: Showa Denko Materials Co., Ltd., Tokyo (JP)

(72) Inventors: Shizu Fukuzumi, Tokyo (JP); Naoya Suzuki, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 537 days.

(21) Appl. No.: 17/914,187

(22) PCT Filed: Jul. 28, 2020

(86) PCT No.: PCT/JP2020/028926
§ 371 (c)(1),
(2) Date: Mar. 13, 2023

(87) PCT Pub. No.: WO2021/192341
PCT Pub. Date: Sep. 30, 2021

(65) Prior Publication Data
US 2023/0207334 A1    Jun. 29, 2023

(30) Foreign Application Priority Data

Mar. 27, 2020   (JP) ................ 2020-058786

(51) Int. Cl.
*H01L 21/56*   (2006.01)
*H01L 23/552*   (2006.01)

(52) U.S. Cl.
CPC .......... *H01L 21/568* (2013.01); *H01L 21/561* (2013.01); *H01L 23/552* (2013.01)

(58) Field of Classification Search
CPC ....... H05K 9/00; H01L 21/561; H01L 23/552; H01L 21/568; H01L 21/6835;
(Continued)

(56) References Cited

U.S. PATENT DOCUMENTS 8,084,300 B1 * 12/2011 San Antonio ......... H01L 23/552
                                                              438/114
2011/0037155 A1 * 2/2011 Pagaila ............ H01L 23/49827
                                                              257/E23.08
(Continued)

FOREIGN PATENT DOCUMENTS

CN         109148388 A         1/2019
CN         110637355 A         12/2019
(Continued)

*Primary Examiner* — Didarul A Mazumder

(74) *Attorney, Agent, or Firm* — FITCH, EVEN, TABIN & FLANNERY, LLP

(57) ABSTRACT

A method for manufacturing a semiconductor package, the method includes: (A) forming a temporary fixing material layer on the first surface (circuit exposed surface) of a panel member including a plurality of semiconductor packages, (B) attaching an adhesive film to the second surface of the panel member; (C) singulating the panel member and the temporary fixing material layer on the adhesive film to obtain a plurality of temporary fixing material piece-attached semiconductor packages; (D) arranging a plurality of the temporary fixing material piece-attached semiconductor packages on a support carrier so that the distance between the adjacent temporary fixing material piece-attached semiconductor packages is 0.1 mm or more; (E) peeling off the first adhesive film from the support carrier and the plurality of temporary fixing material piece-attached semiconductor packages; and (F) forming a functional layer on surfaces of the plurality of temporary fixing material piece-attached semiconductor packages.

6 Claims, 6 Drawing Sheets

(58) Field of Classification Search
CPC ....... H01L 2221/68322; H01L 23/3128; H01L 2221/68354; H01L 2221/68336; B21B 2203/12
USPC ......................................................... 438/110
See application file for complete search history.

(56) References Cited

U.S. PATENT DOCUMENTS

| | | | | |
|---|---|---|---|---|
| 2011/0115060 A1* | 5/2011 | Chiu | ..................... | H01L 24/96 |
| | | | | 257/E23.114 |
| 2011/0115066 A1* | 5/2011 | Kim | ................... | H01L 23/3128 |
| | | | | 257/690 |
| 2011/0127654 A1* | 6/2011 | Weng | ..................... | H01L 24/19 |
| | | | | 257/E23.114 |
| 2014/0332936 A1* | 11/2014 | Beer | .................. | H01L 23/3128 |
| | | | | 257/659 |
| 2019/0006290 A1* | 1/2019 | Jang | .................. | H01L 21/6835 |
| 2021/0125959 A1* | 4/2021 | Matsuura | .............. | H01L 21/561 |

FOREIGN PATENT DOCUMENTS

| | | |
|---|---|---|
| JP | 2000-164682 A | 6/2000 |
| JP | 2008-251934 A | 10/2008 |
| JP | 2012-124466 A | 6/2012 |
| JP | 2015-195398 | 11/2015 |
| JP | 2019-009371 A | 1/2019 |
| WO | 2018/216621 A1 | 11/2018 |

* cited by examiner

PRODUCTION METHOD FOR SEMICONDUCTOR PACKAGES

CROSS-REFERENCE TO RELATED APPLICATIONS

This application is a U.S. national phase application filed under 35 U.S.C. § 371 of International Application No. PCT/JP2020/028926, filed Jul. 28, 2020, designating the United States, which claims priority from Japanese application No. 2020-058786, filed Mar. 27, 2020, which is incorporated herein by reference in its entirety.

TECHNICAL FIELD

The present disclosure relates to a method for manufacturing a semiconductor package, and more particularly to a method for manufacturing a semiconductor package having a functional layer (for example, an electromagnetic wave shield layer) on at least a part of its surface.

BACKGROUND ART

In recent years, as semiconductor packages have become smaller, more highly functional, and more highly integrated, the number of pins of semiconductor chips has increased, the density of semiconductor chips has increased, and the wiring pitch has become narrower. As a result, the original performance of the semiconductor package tends to be adversely affected due to an increase in impedance or signal interference between signal lines. Patent Literature 1 discloses an adhesive film for semiconductor devices having an adhesive layer and an electromagnetic wave shield layer. The adhesive film for semiconductor devices is manufactured through a step of forming an electromagnetic wave shield layer on the surface of the adhesive layer by using a sputtering method or a vapor deposition method.

CITATION LIST

Patent Literature

Patent Literature 1: Japanese Unexamined Patent Publication No. 2012-124466

SUMMARY OF INVENTION

Technical Problem

The present inventors have considered adding such a function to a semiconductor package by directly forming a functional layer, such as an electromagnetic wave shield layer, on the surface of the semiconductor package. The present disclosure provides a method for efficiently manufacturing a semiconductor package in which at least a part of a surface is covered with a functional layer.

Solution to Problem

A method for manufacturing a semiconductor package according to the present disclosure includes the following steps:
(A) forming a temporary fixing material layer on a first surface of a panel member including a plurality of semiconductor packages, circuit surfaces or redistribution layers of the plurality of semiconductor packages being exposed to the first surface;
(B) attaching a first adhesive film to a second surface of the panel member;
(C) singulating the panel member and the temporary fixing material layer on the first adhesive film to obtain a plurality of temporary fixing material piece-attached semiconductor packages;
(D) arranging a plurality of the temporary fixing material piece-attached semiconductor packages on a support carrier so that temporary fixing material pieces of the temporary fixing material piece-attached semiconductor packages are in contact with the support carrier and a distance between the adjacent temporary fixing material piece-attached semiconductor packages is 0.1 mm or more;
(E) peeling off the first adhesive film from the support carrier and the plurality of temporary fixing material piece-attached semiconductor packages; and
(F) forming a functional layer on surfaces of the plurality of temporary fixing material piece-attached semiconductor packages, which are exposed by peeling off the first adhesive film.

After the step (A), curing the temporary fixing material layer may be performed by ultraviolet irradiation or heat treatment.

According to the above method, in the step (D), a plurality of the temporary fixing material piece-attached semiconductor packages are arranged on the support carrier so that the distance between the two adjacent temporary fixing material piece-attached semiconductor packages is 0.1 mm or more. Therefore, in the step (F), a functional layer having a desired thickness can also be formed on the side surface of the semiconductor package by, for example, sputtering or vapor deposition. In addition to this, in the step (F), the functional layer is formed for the semiconductor package whose circuit surface is covered with the temporary fixing material piece. Therefore, it is possible to suppress the material forming the function layer from wrapping around the circuit surface of the semiconductor package. The functional layer is, for example, an electromagnetic wave shield layer (metal layer).

A film having stretchability (hereinafter, referred to as a "stretchable film") may be used as the first adhesive film. In this case, the step (D) may include the following steps:
(d1) increasing a distance between the two adjacent temporary fixing material piece-attached semiconductor packages by applying tension to the first adhesive film; and
(d2) transferring the plurality of temporary fixing material piece-attached semiconductor packages on the first adhesive film to the support carrier in a state in which tension is applied to the first adhesive film.

By performing these steps in the step (D), the plurality of temporary fixing material piece-attached semiconductor packages on the first adhesive film can be collectively arranged on the support carrier.

After the step (F), the following steps may be performed as appropriate so that the semiconductor packages can be efficiently picked up:
(G) attaching a second adhesive film so as to cover the functional layer formed on the surfaces of the plurality of temporary fixing material piece-attached semiconductor packages; and
(H) peeling off the temporary fixing material pieces and the support carrier from the plurality of semiconductor packages on the second adhesive film.

When the functional layer is an electromagnetic wave shield layer, the semiconductor package may have a redistribution layer of less than 50 μm and a ground contact point provided on a side surface of the redistribution layer. Even if the redistribution layer of the semiconductor package is as thin as less than 50 µm, the electromagnetic wave shield layer can be stably formed on the side surface of the redistribution layer in the step (F). Therefore, the ground contact point on the side surface of the redistribution layer and the electromagnetic wave shield layer can be electrically connected to each other (see FIG. 1).

Advantageous Effects of Invention

According to the present disclosure, there is provided a method for efficiently manufacturing a semiconductor package in which at least a part of a surface is covered with a functional layer.

DESCRIPTION OF EMBODIMENTS

Figure 1:
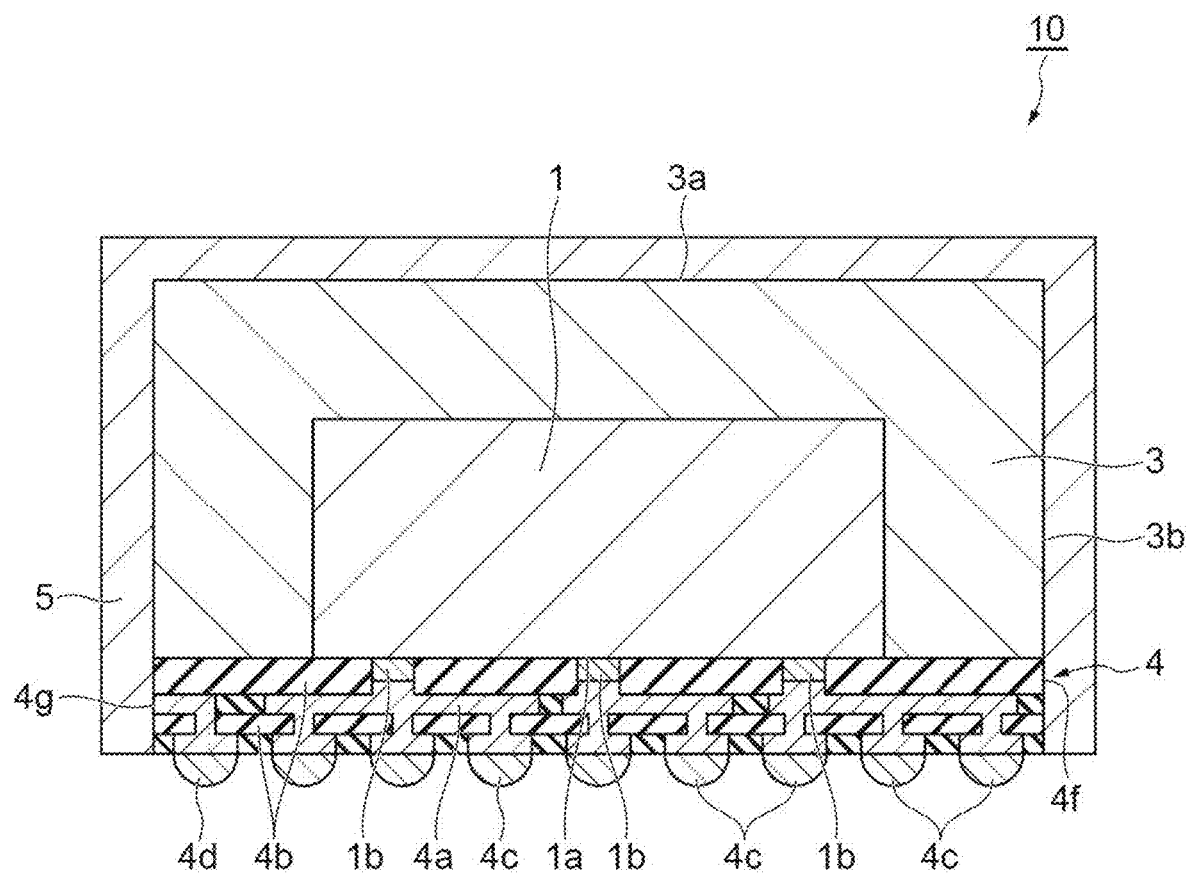
FIG. 1 is a cross-sectional view schematically showing an example of a semiconductor package (fan-out wafer level package) manufactured by using a manufacturing method of the present disclosure.

Hereinafter, an embodiment of the present disclosure will be described in detail with reference to the diagrams. In the following description, the same or equivalent portions are denoted by the same reference numerals, and repeated descriptions thereof will be omitted. In addition, it is assumed that the positional relationship such as up, down, left, and right is based on the positional relationship shown in the diagrams unless otherwise specified. In addition, the dimensional ratio of each diagram is not limited to the ratio shown in the diagram.

When terms such as "left", "right", "front", "rear", "top", "bottom", "upper", and "lower" are used in the description and claims of this specification, these are intended to be illustrative and do not necessarily mean that these are in the relative position at all times. In addition, the term "layer" includes not only a structure having a shape formed on the entire surface but also a structure having a shape partially formed when observed as a plan view.

(Semiconductor Package)

FIG. 1 is a cross-sectional view schematically showing a semiconductor package manufactured by using a manufacturing method according to the present embodiment. A semiconductor package 10 shown in this diagram is called a fan-out wafer level package (Fan-out WLP, FO-WLP). The semiconductor package 10 includes a semiconductor chip 1, a sealing layer 3, a redistribution layer 4, and an electromagnetic wave shield layer 5 (functional layer). In addition, the package form is not limited to FO-WLP, wafer level package (WLP), flip chip chip scale package (FC-CSP), flip chip ball grid array (FC-BGA), memory package, and the like may be used.

The shape of the semiconductor package 10 in plan view is, for example, a square or a rectangle. The area of the semiconductor package 10 in plan view is, for example, 1 to 900 $mm^2$, and may be 9 to 625 $mm^2$ or 25 to 400 $mm^2$ The length of a side of the semiconductor package 10 in plan view is, for example, 1 to 30 mm, and may be 3 to 25 mm or 5 to 20 mm. The thickness (excluding the height of a bump $4c$) of the semiconductor package 10 is, for example, 100 to 1500 µm, and may be 200 to 1000 µm.

The semiconductor chip 1 has a circuit surface $1a$ and a plurality of bumps $1b$ (protruding electrodes) formed on the circuit surface $1a$. The circuit surface $1a$ may have a relatively flat metal pad, such as a Ni/Au plated pad. The bumps $1b$ are, for example, a copper bump and a solder bump. The shape of the semiconductor chip 1 in plan view is, for example, a square or a rectangle. The area of the semiconductor chip 1 in plan view is, for example, 1 to 400 $mm^2$, and may be 9 to 225 $mm^2$ or 25 to 100 $mm^2$ The length of a side of the semiconductor chip 1 in plan view is, for example, 1 to 20 mm, and may be 3 to 15 mm or 5 to 10 mm. The thickness (excluding the height of the bump $1b$) of the semiconductor chip 1 is, for example, 50 to 775 µm, and may be 100 to 500 µm.

The sealing layer 3 is formed of a thermosetting resin composition. The sealing layer 3 protects the semiconductor chip 1 from light, heat, moisture, dust, physical impact, and the like. The sealing layer 3 is formed by, for example, compression molding, transfer molding, or lamination of a film-like sealing material. The thickness of the sealing layer 3 is, for example, 50 µm or more, and may be 100 µm or more.

The redistribution layer 4 is electrically connected to the bump $1b$ of the semiconductor chip 1. The redistribution layer 4 is formed by a conductor portion $4a$, an insulating portion $4b$, and bumps $4c$ and $4d$. The conductor portion $4a$ electrically connects the bump $1b$ of the semiconductor chip 1 and the bump $4c$. The bump $4d$ shown on the left end of FIG. 1 is electrically connected to the electromagnetic wave shield layer 5. A side surface $4f$ of the redistribution layer 4 has a ground contact point $4g$. The ground contact point $4g$ is in contact with the electromagnetic wave shield layer 5. Therefore, the electromagnetic wave shield layer 5 can be grounded. In addition, although one ground contact point $4g$ is shown in FIG. 1, the semiconductor package 10 may have a plurality of ground contact points on the side surface $4f$ of the redistribution layer 4.

The electromagnetic wave shield layer 5 covers a surface $3a$ and a side surface $3b$ of the sealing layer 3, and covers at least a part of the side surface 4f of the redistribution layer 4. The electromagnetic wave shield layer 5 is, for example, a metal layer formed by sputtering or vapor deposition. The electromagnetic wave shield layer 5 contains, for example, metal elements such as copper, chromium, and nickel. The metal element forming the electromagnetic wave shield layer 5 may be of one type, or may be of two or more types. The thickness of the electromagnetic wave shield layer 5 is, for example, 0.01 to 100 µm, and may be 0.05 to 50 µm. In addition, the method of forming the electromagnetic wave shield layer 5 is not limited to sputtering or vapor deposition, and a screen printing method, a spray printing method, an electroless plating method, an electrolytic plating method, and the like may be used.

(Semiconductor Package Manufacturing Method)

Figure 3A:
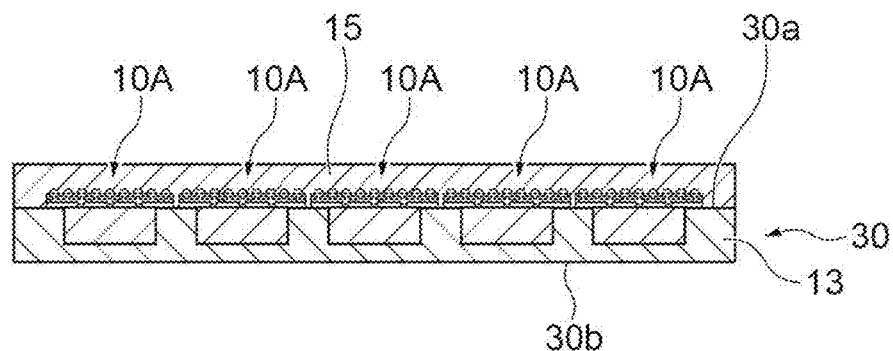
FIG. 3A is a cross-sectional view schematically showing a state in which a temporary fixing material layer is formed on a first surface of a panel member.
Figure 3B:
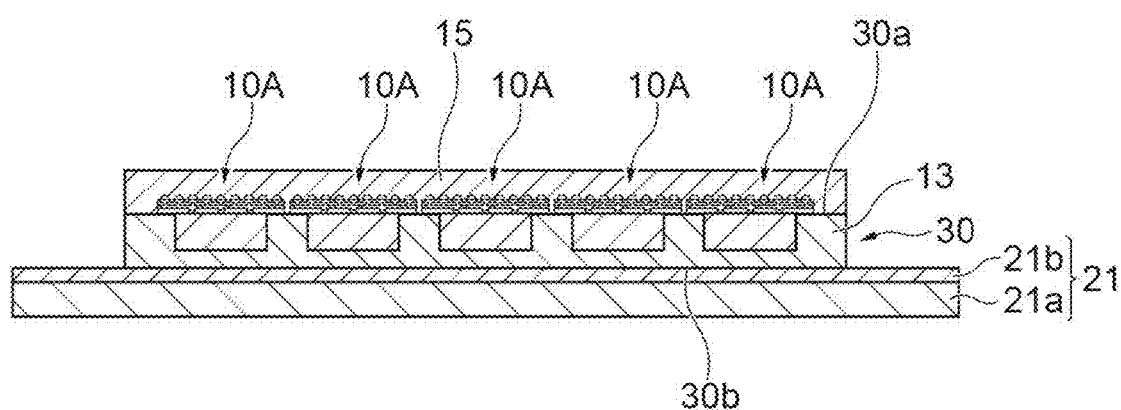
FIG. 3B is a cross-sectional view schematically showing a state in which a first adhesive film is attached to a second surface of the panel member.

Next, a method for manufacturing the semiconductor package 10 will be described. For example, the semiconductor package 10 can be manufactured through the following steps:

(a) forming a temporary fixing material layer 15 on a first surface 30a of a panel member 30 including a plurality of semiconductor packages 10A (see FIG. 3A);

(b) attaching an adhesive film 21 (first adhesive film) to a second surface 30b of the panel member 30 (see FIG. 3B).

Figure 3C:
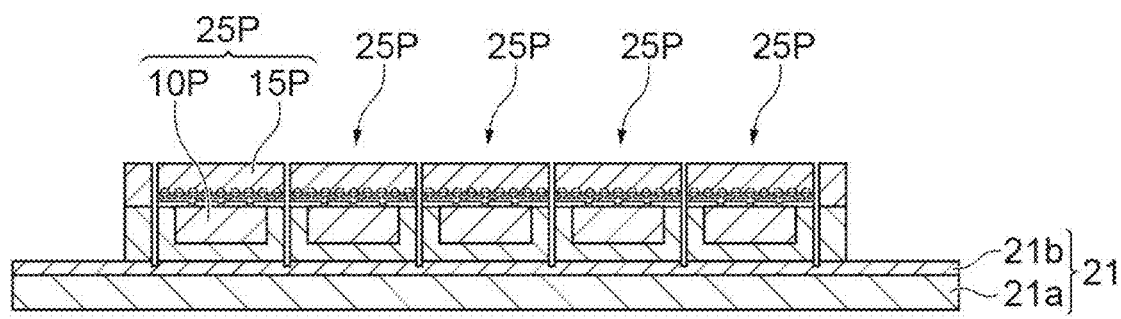
FIG. 3C is a cross-sectional view schematically showing a state in which the panel member and the temporary fixing material layer are singulated into a plurality of temporary fixing material piece-attached semiconductor packages.

(c) singulating the panel member 30 and the temporary fixing material layer 15 on the adhesive film 21 to obtain a plurality of temporary fixing material piece-attached semiconductor packages 25P (see FIG. 3C).

Figure 4A:
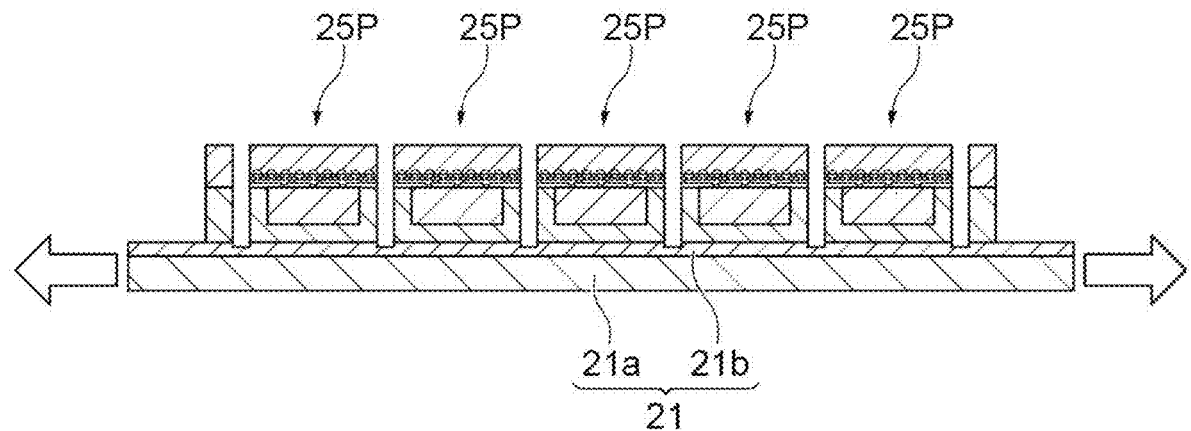
FIG. 4A is a cross-sectional view schematically showing a state in which a distance between two adjacent temporary fixing material piece-attached semiconductor packages is increased by applying tension to the first adhesive film.
Figure 4B:
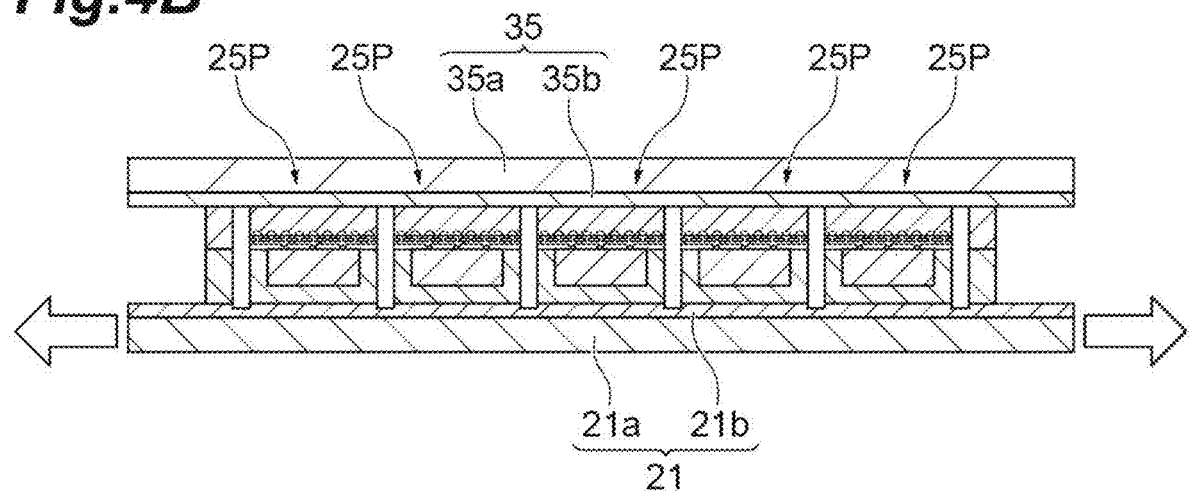
FIG. 4B is a cross-sectional view schematically showing a state in which a support carrier is attached to a plurality of temporary fixing material piece-attached semiconductor packages on the first adhesive film while tension is being applied to the first adhesive film.

(d) arranging a plurality of temporary fixing material piece-attached semiconductor packages 25P on a support carrier 35 so that the temporary fixing material pieces 15P of the temporary fixing material piece-attached semiconductor packages 25P are in contact with the support carrier 35 and the distance between the adjacent temporary fixing material piece-attached semiconductor packages 25P is 0.1 mm or more (see FIG. 4B).

Figure 4C:
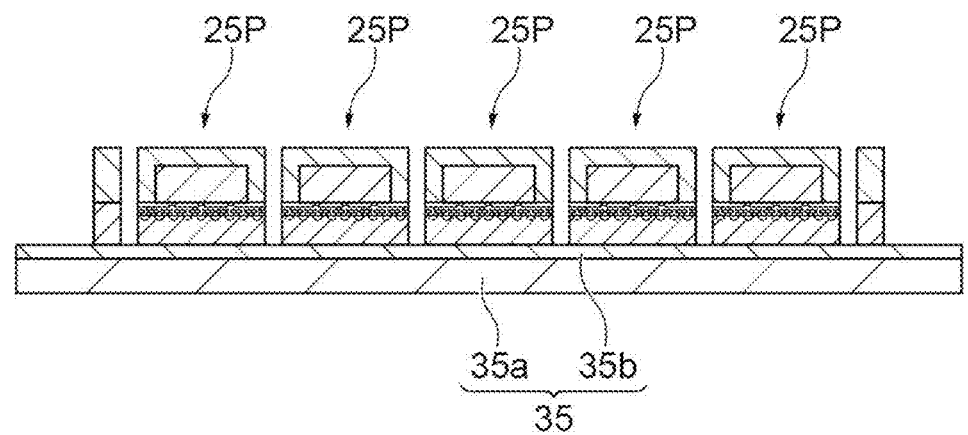
FIG. 4C is a cross-sectional view schematically showing a state in which the first adhesive film is peeled off from the state shown in FIG. 4B.

(e) peeling off the adhesive film 21 from the support carrier 35 and the plurality of temporary fixing material piece-attached semiconductor packages 25P (see FIG. 4C).

Figure 5:
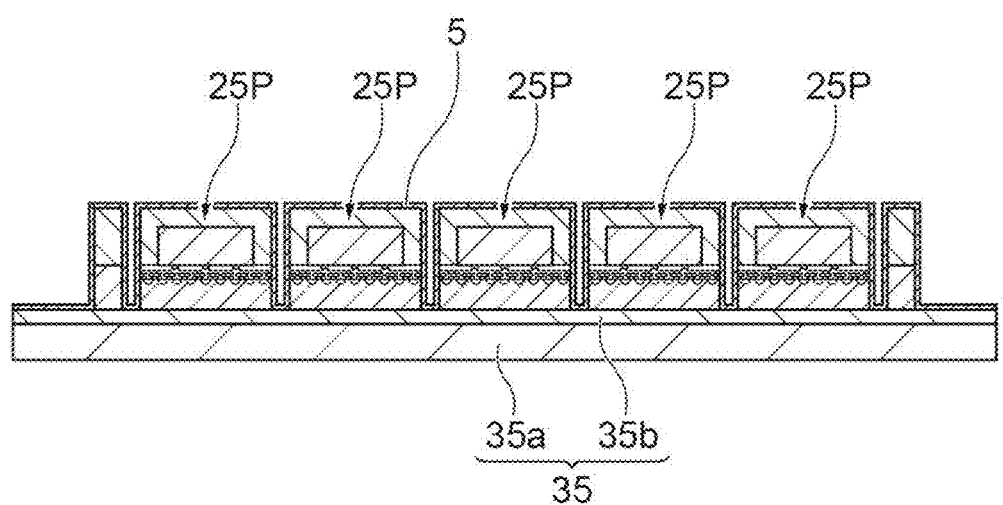
FIG. 5 is a cross-sectional view schematically showing a state in which an electromagnetic wave shield layer (functional layer) is formed on the surfaces of a plurality of temporary fixing material piece-attached semiconductor packages.

(f) forming the electromagnetic wave shield layer 5 on the surfaces of the plurality of temporary fixing material piece-attached semiconductor packages 25P, which are exposed by peeling off the adhesive film 21, by sputtering or vapor deposition (see FIG. 5).

According to the manufacturing method described above, the following effects can be obtained.

In the step (d), a plurality of temporary fixing material piece-attached semiconductor packages 25P are arranged on the support carrier 35 in a state in which the distance between the two adjacent temporary fixing material piece-attached semiconductor packages 25P is increased. Therefore, in the step (f), the electromagnetic wave shield layer 5 having a desired thickness can also be formed on the side surface of a semiconductor package 10P. In addition, the semiconductor package 25P with a temporary fixing material piece is formed by the semiconductor package 10P (before forming the electromagnetic wave shield layer 5) and the temporary fixing material piece 15P.

In the step (f), the electromagnetic wave shield layer 5 is formed for the semiconductor package 10P in which the redistribution layer 4 is covered with the temporary fixing material piece 15P. Therefore, it is possible to suppress the material forming the electromagnetic wave shield layer 5 from wrapping around the surface of the semiconductor package 10 on the redistribution layer 4 side.

In addition, the first surface 30a of the panel member 30 is a surface where the redistribution layer 4 is exposed. It can be said that the redistribution layer 4 belongs to the semiconductor package 10A or the panel member 30, and it can also be said that the redistribution layer 4 belongs to the semiconductor package 10P or the semiconductor package 10 after the semiconductor package 10P or the semiconductor package 10 is formed. In addition, a part of the circuit surface 1a of the semiconductor chip 1 may be exposed on the first surface 30a of the panel member 30.

[Step (a)]

Figure 2:
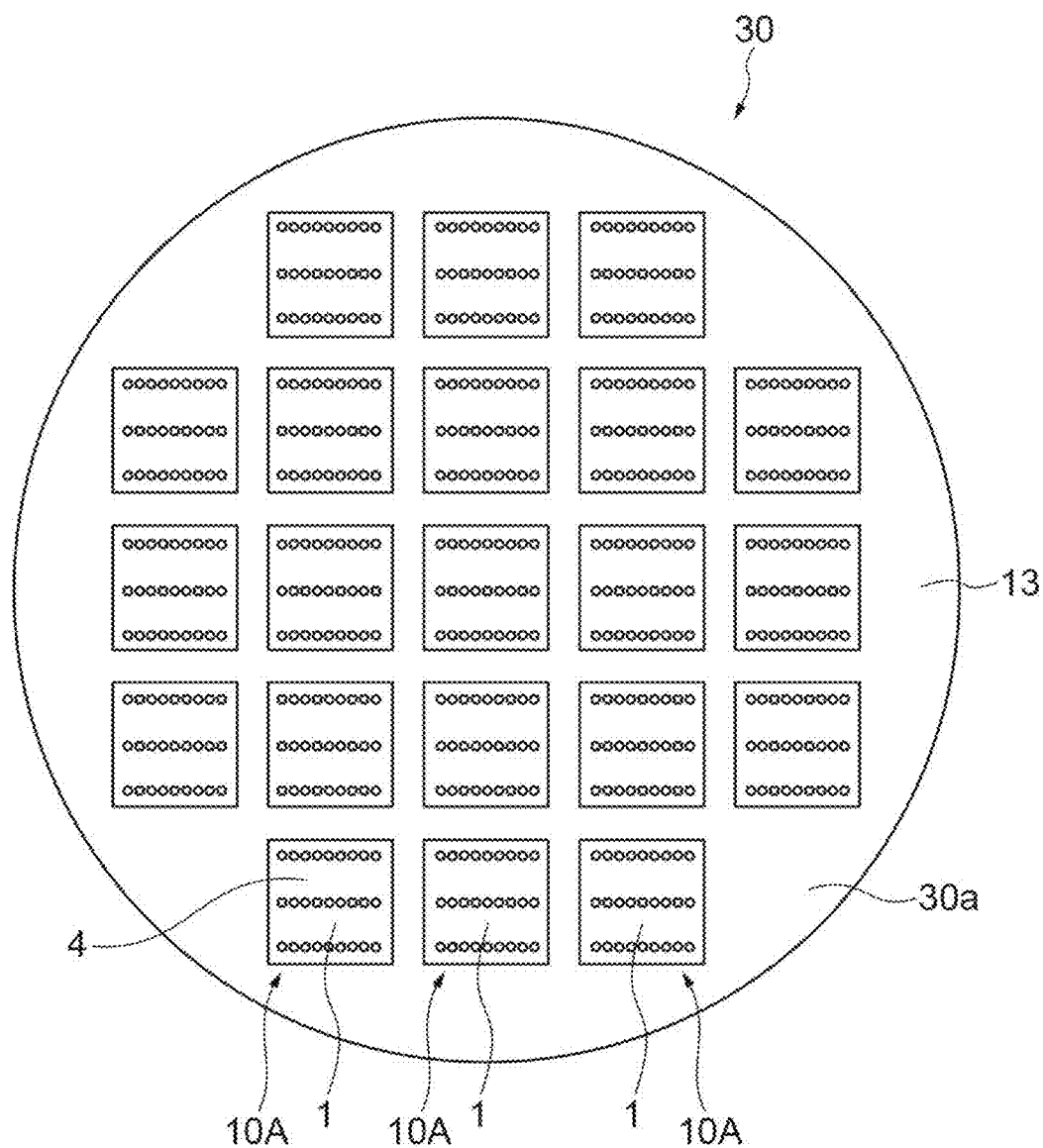
FIG. 2 is a plan view schematically showing an example of a panel member for fan-out wafer level packages.

The step (a) is a step of forming the temporary fixing material layer 15 on the first surface 30a of the panel member 30 including a plurality of semiconductor chips 1 and a sealing material 13 that seals the plurality of semiconductor chips 1. In the present embodiment, the case of using a fan-out wafer level package (Fan-out WLP, FO-WLP) as the panel member 30 will be taken as an example. FIG. 2 is a plan view schematically showing the panel member 30, which is an FO-WLP. The panel member 30 has an approximately circular shape in plan view, and has a diameter of, for example, 100 to 300 mm. The panel member 30 is formed by a plurality of semiconductor chips 1 and the sealing material 13 that seals the semiconductor chips 1. In FIG. 2, for the sake of convenience, 21 semiconductor chips 1 are shown. However, the number of semiconductor chips 1 provided in the FO-WLP is, for example, 100 or more, and may be 400 to 6000 or 1600 to 24000.

FIG. 3A is a cross-sectional view schematically showing a state in which the temporary fixing material layer 15 is formed on the first surface 30a of the panel member 30. The temporary fixing material layer 15 is formed of a resin composition having adhesion to the panel member 30. A paste of such a resin composition may be used to form the temporary fixing material layer 15, or a film of the resin composition may be formed in advance and attached to the first surface 30a. As shown in FIG. 3A, it is preferable that the temporary fixing material layer 15 is in contact with the circuit surface 1a of the panel member 30 and the bump 1b is embedded in the temporary fixing material layer 15. Since the temporary fixing material layer 15 is in close contact with the circuit surface 1a, it is possible to significantly suppress the material forming the electromagnetic wave shield layer 5 from wrapping around the circuit surface 1a even after the electromagnetic wave shield layer 5 is formed in the step (f).

[Step (b)]

The step (b) is a step of attaching the adhesive film 21 (first adhesive film) to the second surface 30b of the panel member 30 (see FIG. 3B). The adhesive film 21 includes a base film 21a and an adhesive layer 21b. The adhesive film 21 is preferably a stretchable film. As a stretchable film, for example, an expandable film used for stealth dicing or the like can be used. The adhesive film 21 is used for the singulation of the panel member 30 in the step (c) and for an increase in the distance between the adjacent temporary fixing material piece-attached semiconductor packages 25P in the step (d). The increased distance is sufficient as long as the electromagnetic wave shield layer 5 can be appropriately formed on the side surface of the semiconductor package 10P in the step (f), and the distance need not necessarily be uniform over the entire area. Therefore, as the adhesive film 21, an adhesive film (for example, a dicing film) with a predetermined degree of stretchability may be used instead of the expandable film.

[Step (c)]

The step (c) is a step of singulating the panel member 30 and the temporary fixing material layer 15 on the adhesive film 21 into a plurality of temporary fixing material piece-attached semiconductor packages 25P (see FIG. 3C). The separation distance between the two adjacent temporary fixing material piece-attached semiconductor packages 25P is almost the same as the width of a blade used for cutting, for example, about 50 µm.

[Step (d)]

The step (d) is a step of arranging a plurality of temporary fixing material piece-attached semiconductor packages 25P on the support carrier 35 so that the temporary fixing material pieces 15P of the temporary fixing material piece-attached semiconductor packages 25P are in contact with the support carrier 35 and the distance between the adjacent temporary fixing material piece-attached semiconductor packages 25P is 0.1 mm or more. In the step (d), it is possible to collectively arrange the temporary fixing material piece-attached semiconductor packages 25P on the adhesive film 21 onto the support carrier 35, for example, by performing the following steps:

(d1) increasing the distance between two adjacent temporary fixing material piece-attached semiconductor packages 25P by applying tension to the adhesive film 21 (see FIG. 4A).

(d2) transferring the plurality of temporary fixing material piece-attached semiconductor packages 25P on the adhesive film 21 to the support carrier 35 in a state in which tension is applied to the adhesive film 21.

Since the support carrier 35 is exposed to sputtering or vapor deposition in the step (f), the support carrier 35 is formed of a material having sufficient heat resistance. The support carrier 35 has, for example, a stacked structure including a base film 35a having heat resistance and an adhesive layer 35b having high adhesiveness to the temporary fixing material pieces 15P. As described above, the base film 35a may be formed of any material having heat resistance, and examples thereof include a polyimide film, a PET film (stretchable), and polyvinylidene chloride film. The base film 35a may be a single-layer film, or may be a multi-layer film obtained by combining two or more of the above plastic films or two or more of the same plastic films. The adhesive layer 35b may be formed of, for example, an adhesive composition, and may exhibit strong adhesion to the temporary fixing material pieces 15P by being heated.

The increased separation distance between the two adjacent temporary fixing material piece-attached semiconductor packages 25P is preferably 100 to 2000 µm, more preferably 200 to 800 µm. When this distance is 2000 µm or less, there is a tendency that breakage of the temporary fixing material layer 15 can be suppressed. The ratio (D/T) between the distance D and the thickness T of the semiconductor package is preferably 1 or more. When the ratio D/T is 1 or more, the electromagnetic wave shield layer 5 having a desired thickness can be stably formed on the side surface of the semiconductor package 10P by sputtering or vapor deposition in the step (e).

[Step (e)]

The step (e) is a step of peeling off the adhesive film 21 from the support carrier 35 and the plurality of temporary fixing material piece-attached semiconductor packages 25P. FIG. 4C is a cross-sectional view schematically showing a state in which the adhesive film 21 is peeled off from the state shown in FIG. 4B. In addition, FIG. 4C shows a state turned upside down from the state of FIG. 4B. Before performing the step (e), for example, the adhesive film 21 may be irradiated with ultraviolet rays to reduce the adhesive force of the adhesive film 21.

[Step (f)]

The step (f) is a step of forming the electromagnetic wave shield layer 5 on the surfaces of the plurality of temporary fixing material piece-attached semiconductor packages 25P, which are exposed by peeling off the adhesive film 21, by sputtering or vapor deposition. Sputtering can be performed by using, for example, CCS-2110 (product name) manufactured by SHIBAURA MECHATRONICS CORPORATION. Vapor deposition can be performed by using, for example, AIP-G series (product name, "AIP" is a registered trademark) manufactured by Kobe Steel, Ltd. (KOBELCO). FIG. 5 is a cross-sectional view schematically showing a state in which the electromagnetic wave shield layer 5 is formed on the surfaces of the plurality of temporary fixing material piece-attached semiconductor packages 25P.

After the step (f), in order to be able to efficiently pick up the semiconductor package 10, the plurality of temporary fixing material piece-attached semiconductor packages 25P may be transferred from the support carrier 35 to an adhesive film 22 (second adhesive film) to pick up the semiconductor package 10 from the adhesive film 22. That is, after the step (f), the following steps may be performed as appropriate. In addition, as the adhesive film 22, for example, a film with an adhesive force reduced by ultraviolet irradiation or heating may be used.

Figure 6A:
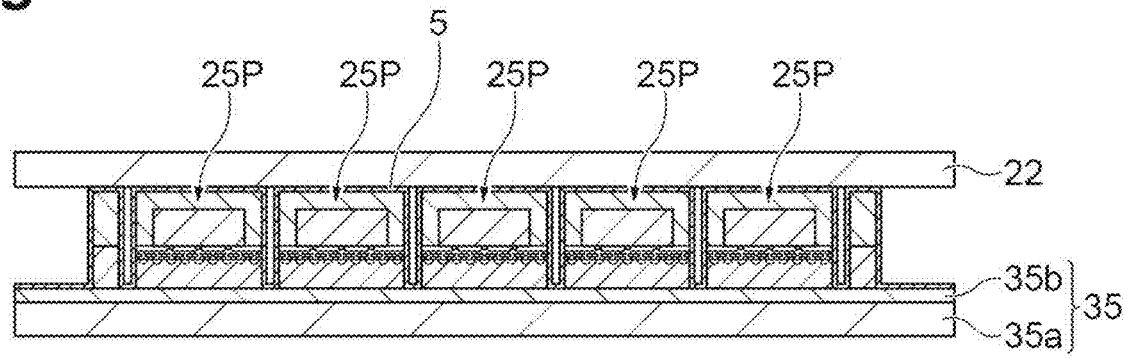
FIGS. 6A to 6C are cross-sectional views schematically showing a process of picking up a semiconductor package.

(g) Attaching the adhesive film 22 so as to cover the electromagnetic wave shield layer 5 of the plurality of temporary fixing material piece-attached semiconductor packages 25P after the step (f) (see FIG. 6A).

Figure 6B:
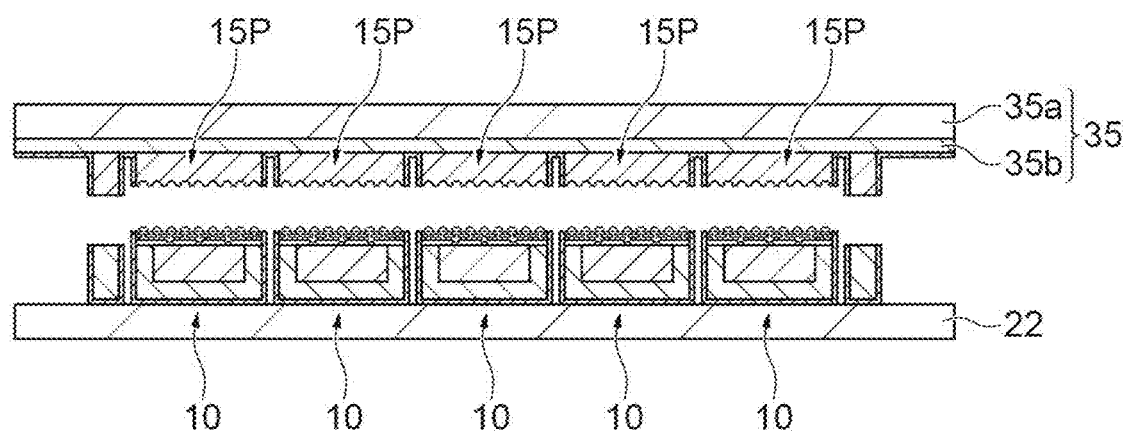

(h) Peeling off the temporary fixing material pieces 15P and the support carrier 35 from the plurality of semiconductor packages 10 on the adhesive film 22 (see FIG. 6B).

(i) Reducing the adhesive force of the adhesive film 22 with respect to the semiconductor package 10.

(j) Picking up the semiconductor package 10 from the adhesive film 22.

Figure 6C:
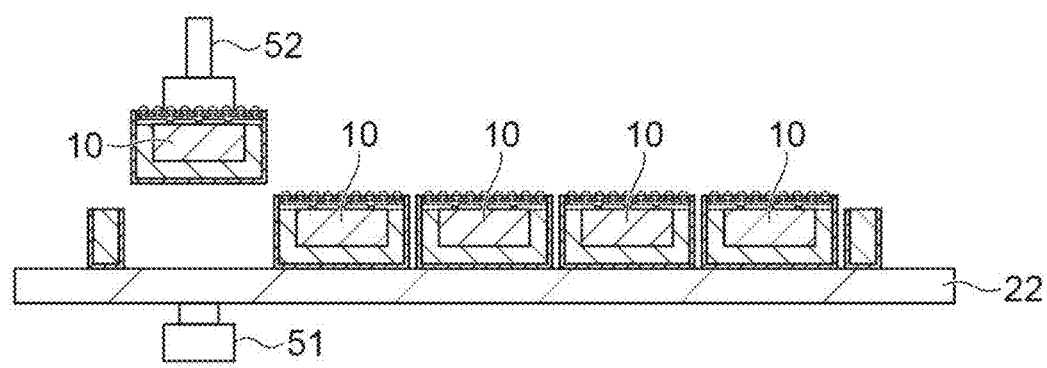

FIG. 6C is a cross-sectional view schematically showing how the semiconductor package 10 is picked up from the adhesive film 22. As shown in FIG. 6C, the semiconductor package 10 is sucked by a collet 52 while pushing up the semiconductor package 10 from the lower surface side of the adhesive film 22 by a push-up jig 51, thereby picking up the semiconductor package 10.

While the embodiment of the present disclosure has been described above in detail, the present invention is not limited to the above embodiment. For example, in the above embodiment, the case where the electromagnetic wave shield layer 5 is formed as a functional layer has been illustrated. However, instead of the electromagnetic wave shield layer 5, a heat dissipation layer and/or a protective layer may be formed on the surface of the semiconductor package 10P. In addition, in the above embodiment, the case where the adhesive film 21 having stretchability is used in the step (c) and the plurality of temporary fixing material piece-attached semiconductor packages 25P are collectively transferred to the support carrier 35 in the step (d) has been illustrated. However, a dicing film with no stretchability or low stretchability may be used in the step (c), and the temporary fixing material piece-attached semiconductor packages 25P after dicing may be picked up one by one and arranged on the support carrier 35.

According to the present embodiment, even if the redistribution layer 4 of the semiconductor package 10 is as thin as less than 50 µm, there is an effect that the electromagnetic wave shield layer 5 can be stably grounded. That is, since the electromagnetic wave shield layer 5 is stably formed on the side surface of the redistribution layer 41 in the step (f), a ground contact point 42 can be provided on a side surface 41f of the redistribution layer 41. The thickness of the redistribution layer 41 may be less than 50 μm, or may be less than 30 μm. The lower limit of the thickness of the redistribution layer 41 is, for example, about 10 μm.

EXAMPLES

The present disclosure will be described in more detail by way of the following examples, but the present invention is not limited to these examples.

A WLP panel member (diameter: 24 mm, thickness: 0.3 mm, the number of semiconductor chips: 16, bump on the circuit surface: solder) was prepared. A temporary fixing film having an adhesive layer was attached to the first surface (circuit surface) of the WLP panel member (step (A)). A stretchable film (a dicing film having stretchability, a first adhesive film) was attached to the second surface (surface opposite to the circuit surface) of the WLP panel member (step (B)). By performing blade dicing under the following conditions, a plurality of temporary fixing material piece-attached semiconductor packages (size of 6 mm×6 mm in plan view) were formed on the stretchable film (step (C)).

Dicer: DFD3361 (manufactured by DISCO Inc.)
Blade: ZH05-SD3000-N1-70 (manufactured by DISCO Inc.)
Blade width: 28 μm
Blade rotation speed: 30000 rpm
Dicing speed: 10 mm/section A ring having an inner diameter larger than the diameter of the WLP panel member was pressed against the stretchable film from below to give tension to the stretchable film (step (d1)). As a result, the distance between two adjacent temporary fixing material piece-attached semiconductor packages was increased to about 320 μm. While applying tension to the stretchable film, a support carrier was attached with a vacuum laminator so as to cover the plurality of temporary fixing material pieces, and the plurality of temporary fixing material piece-attached semiconductor packages were transferred to the support carrier (step (d2)). A polyimide film having an ultraviolet curable adhesive layer on its surface was used as a support carrier. Thereafter, the stretchable film was peeled off from the plurality of temporary fixing material piece-attached semiconductor packages (step (E)).

On the surfaces of the plurality of temporary fixing material piece-attached semiconductor packages on the polyimide film, an electromagnetic wave shield layer (thickness: 4380 nm) was formed by sputtering (step (F)). Chromium and copper were used as targets.

When the circuit surface of the semiconductor package was magnified and observed, it was not observed that the material forming the electromagnetic wave shield layer wrapped around the circuit surface.

INDUSTRIAL APPLICABILITY

According to the present disclosure, there is provided a method for efficiently manufacturing a semiconductor package in which at least a part of a surface is covered with a functional layer.

REFERENCE SIGNS LIST

1: semiconductor chip, 1a: circuit surface, 1b: bump, 3: sealing layer, 3a: surface, 3b: side surface, 4: redistribution layer, 4a: conductor portion, 4b: insulating portion, 4c, 4d: bump, 4f: side surface, 4g: ground contact point, 5: electromagnetic wave shield layer (functional layer), 10: semiconductor package, 10A: semiconductor package (before singulation), 10P: semiconductor package (before forming functional layer), 13: sealing material, 15: temporary fixing material layer, 15P: temporary fixing material piece, 21: adhesive film (first adhesive film), 21a: base film, 21b: adhesive layer, 22: adhesive film (second adhesive film), 25P: semiconductor package, 30: panel member, 30a: first surface, 30b: second surface, 35: support carrier, 35a: base film, 35b: adhesive layer, 51: jig, 52: collet.

The invention claimed is:

1. A method for manufacturing a semiconductor package, the method comprising:
   (A) forming a temporary fixing material layer on a first surface of a panel member including a plurality of semiconductor packages, circuit surfaces or redistribution layers of the plurality of semiconductor packages being exposed to the first surface;
   (B) attaching a first adhesive film to a second surface of the panel member;
   (C) singulating the panel member and the temporary fixing material layer on the first adhesive film to obtain a plurality of temporary fixing material piece-attached semiconductor packages;
   (D) arranging the plurality of the temporary fixing material piece-attached semiconductor packages on a support carrier so that temporary fixing material pieces of the plurality of temporary fixing material piece-attached semiconductor packages are in contact with the support carrier and a distance between two adjacent of the plurality of temporary fixing material piece-attached semiconductor packages is 0.1 mm or more;
   (E) peeling off the first adhesive film from the support carrier and the plurality of temporary fixing material piece-attached semiconductor packages; and
   (F) forming a functional layer on surfaces of the plurality of temporary fixing material piece-attached semiconductor packages, which are exposed by peeling off the first adhesive film.

2. The method for manufacturing a semiconductor package according to claim 1, wherein the first adhesive film has stretchability, and
   the step (D) includes:
   (d1) increasing a distance between two adjacent of the plurality of temporary fixing material piece-attached semiconductor packages by applying tension to the first adhesive film; and
   (d2) transferring the plurality of temporary fixing material piece-attached semiconductor packages on the first adhesive film to the support carrier in a state in which tension is applied to the first adhesive film.

3. The method for manufacturing a semiconductor package according to claim 1, wherein the functional layer is a metal layer formed by sputtering or vapor deposition.

4. The method for manufacturing a semiconductor package according to claim 1, further comprising:
   (G) attaching a second adhesive film so as to cover the functional layer formed on the surfaces of the plurality of temporary fixing material piece-attached semiconductor packages; and
   (H) peeling off the temporary fixing material pieces and the support carrier from the plurality of semiconductor packages on the second adhesive film.

5. The method for manufacturing a semiconductor package according to claim 1, wherein the functional layer is an electromagnetic wave shield layer.

6. The method for manufacturing a semiconductor package according to claim 5, wherein the semiconductor package has a redistribution layer of less than 50 μm and a ground contact point provided on a side surface of the redistribution layer.

\* \* \* \* \*